United States Patent [19]

Brahmbhatt

[11] Patent Number: 4,823,317

[45] Date of Patent: Apr. 18, 1989

[54] EEPROM PROGRAMMING SWITCH

[75] Inventor: Dhaval J. Brahmbhatt, San Jose, Calif.

[73] Assignee: ICT International CMOS Technolgy, Inc., San Jose, Calif.

[21] Appl. No.: 146,231

[22] Filed: Jan. 20, 1988

[51] Int. Cl.⁴ .................. G11C 7/02; H03K 17/687; H03K 19/017

[52] U.S. Cl. .................. 365/189; 307/577; 307/578; 307/581; 307/443; 307/448; 307/450

[58] Field of Search ............... 307/443, 448, 450, 577, 307/578, 581; 365/189

[56] References Cited

FOREIGN PATENT DOCUMENTS 2803226 7/1979 Fed. Rep. of Germany ...... 307/578
0003747 1/1978 Japan ................................ 307/578

Primary Examiner—Stanley D. Miller
Assistant Examiner—Margaret R. Wambach
Attorney, Agent, or Firm—Flehr, Hohbach, Test, Albritton & Herbert

[57] ABSTRACT

An EEPROM programming switch includes a first enhancement mode field effect transistor interconnected between a word line and a programming voltage potential, and a second enhancement mode field effect transistor connected between a charge pump node and the programming voltage. The gate electrode of the first transistor is connected to the charge pump node and the gate electrode of the second transistor is connected to the word line. Decoding means is providing for preventing charge accumulation of the word line when the word line is not selected and for permitting charge accumulation of the word line when the word line is selected for programming.

5 Claims, 1 Drawing Sheet

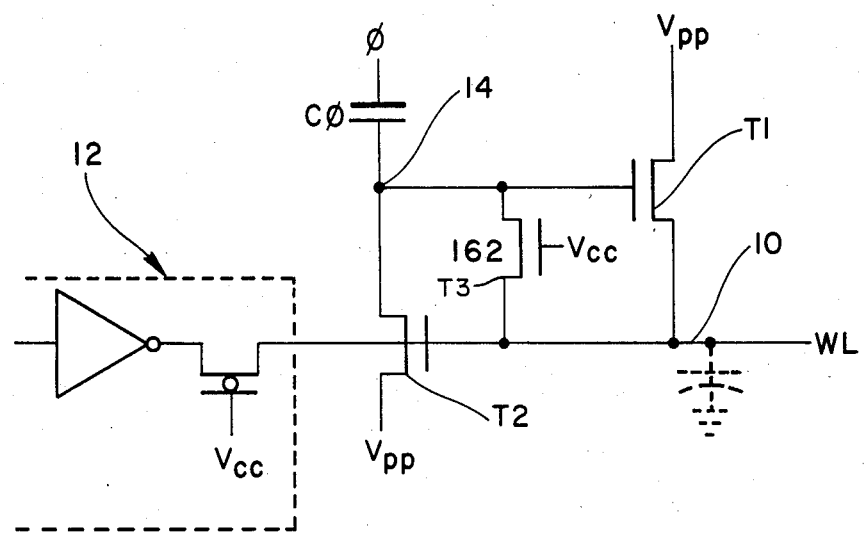
FIG.—1

EEPROM PROGRAMMING SWITCH

BACKGROUND OF THE INVENTION

This invention relates generally to programmable memories, and more particularly the invention relates to programming circuitry for EEPROM devices.

In the programming of electrical memories such as PROMs and EEPROMs a programming voltage in the order of 20 volts is required. With PROM devices an external power source is utilized. However, the programming of EEPROMs is accomplished using the chip operating voltage, typically 5 volts, with a high-voltage generator circuit in the chip developing the requisite programming voltage. In programming mode operation, a selected word line is raised to the programming voltage level sequentially by using a charge pump. See Brahmbhatt, U.S. Pat. No. 4,442,481 for "Low Power Decoder Circuit," and Gupta, U.S. Pat. No. 4,511,811 for "Charge Pump for Providing Programming Voltage to the Word Lines in a Semiconductor Memory Array."

Copending Brahmbhatt application Ser. No. A-46290, filed concurrently herewith, for EEPROM PROGRAMMING SWITCH OPERABLE AT LOW $V_{CC}$, uses native transistors in charge pump circuitry, thus reducing the voltage drop across the transistors. However, bias means is required with the native transistors in a charge pump circuit to prevent the native transistors from operating in a depletion mode. This increases the circuit complexity.

SUMMARY OF THE INVENTION

An object of the invention is a simple charge pump circuit for an EEPROM device.

A feature of the invention is the use of a pair of enhancement mode transistors for providing a switch for charge pumping a selected word line in an EEPROM device.

Briefly, a word line activated for programming by an addressing circuit is connected to a programming voltage $V_{PP}$ through a first enhancement mode transistor. The gate of the transistor is connected to one terminal (charge pump node) of a charge pump capacitor, the other terminal of the charge pump capacitor being connected to the clock voltage, $V\phi$. The activated word line is charged incrementally through the first transistor until the word line approximates the voltage of the one terminal of the charge pump capacitor. The charge pump node of the charge pump capacitor is connected to the programming voltage through a second enhancement mode transistor. The gate of the second enhancement mod transistor is connected to the word line, whereby the one terminal of the charge pump capacitor is periodically charged to approximately the voltage on the word line. Thereafter, when the clock $\phi$ goes high, the charge on the one terminal of the capacitor is raised or pumped above the word line voltage by approximately the voltage $V\phi$. The raised voltage is connected to the gate of the first transistor, thereby rendering the transistor conductive and again charging the word line incrementally to a value approximately equal to the voltage on the one terminal of the charge pump capacitor, less the voltage drop across the transistor.

The invention and objects and features thereof will be more readily apparent from the following detailed description when taken with the drawing in which a schematic of a preferred embodiment of the invention is disclosed.

DETAILED DESCRIPTION OF ILLUSTRATIVE EMBODIMENT

Referring now to the drawing, a word line 10 is selected for programming by a decoding circuit shown generally at 12. The decoding circuitry is conventional such as disclosed in the Brahmbhatt and Gupta patents, supra, whereby an unselected word line is grounded and a selected word line is allowed to be charged to the programming voltage $V_{PP}$. The capacitance, $C_{w1}$, of the word line is indicated by a broken line. The programming voltage $V_{PP}$ is generated by a conventional circuit in the EEPROM as derived from the supply voltage $V_{CC}$ of the circuit. The programming clock, $\phi$, is applied across the capacitor $C_\phi$ in the circuit. The capacitor $C_\phi$ can be an enhancement mode transistor or a native transistor.

Enhancement mode transistor T1 is connected between the word line 10 and the programming voltage $V_{PP}$, and the enhancement mode transistor T2 is serially connected between one terminal of the capacitor $C_\phi$ and the programming voltage $V_{PP}$. The gate of transistor T1 is connected to the charge pump terminal 14 of the capacitor $C_\phi$, and the gate of transistor T2 is connected to the word line 10.

During a programming mode, the word line 10 is allowed to develop a programming voltage of $V_{PP}$. Capacitor $C_\phi$ biases the gate of transistor T1 whereby the word line 10 is allowed to incrementally receive charge from $V_{PP}$ until the full programming charge is developed on the word line. When the clock, $\phi$, is high, a voltage of $V_{CC}$ is applied across capacitor $C_V$ and pumps up voltage upon node 14 by approximately the increment $V_{CC}$ above the voltage on word line 10. This causes transistor T1 to turn on and apply charge on the word line 10 until the gate-to-source voltage Vgs of transistor T1 is less than the threshold voltage of transistor T1, whereupon the transistor T1 is turned off. Thereafter, with the clock $\phi$ off, the voltage on word line 10 as applied to the gate of transistor T2 renders the transistor conductive. A charge from $V_{PP}$ (less the voltage drop across transistor T2) is applied to the node 14 to raise node 14 to approximately the voltage on word line 10. Thereafter, when $\phi$ again goes high, the voltage on node 14 is pumped up by the increment, $V_{CC}$, thus again rendering transistor T1 conductive and increasing the voltage on word line 10 by the increment $V_{CC}$ (less the voltage drop across transistor T1). This incremental charging of the word line and the node 14 continues until the full programming voltage $V_{PP}$ is developed on the word line 10. At that time, an EEPROM cell as selected by word line 10 and a bit line can be programmed.

An enhancement mode transistor 16 is connected between the charge pump 14 and word line 10 to deplete any stored charge when the word line is not to be charged to the programming potential $V_{PP}$.

The described circuit is simple in structure and 30 operable with a $V_{CC}$ greater than approximately twice the voltage drop across a single enhancement mode transistor. The simplicity of the circuit represents an improvement over conventional switches for charge pump circuitry in EEPROM devices.

While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

I claim:

1. A circuit for charging a word line in an EEPROM device comprising a word line, decoder means operably connected to said word line to prevent charge accumulation on said word line when said word line is not selected for programming and for allowing charge accumulation on said word line when said word line is selected for programming, a programming voltage ($V_{PP}$) source, a clock voltage ($\phi$) source, capacitive means having first and second terminals, said first terminal connected to said clock voltage source and said second terminal defining a charge pump node, a first field effect transistor serially connected between said programming voltage source and said word line, said first transistor having a gate electrode, means connecting said charge pump node to said gate electrode of said first transistor, a second field effect transistor serially connected between said programming voltage source and said charge pump node, said second transistor having a gate electrode, and means connecting said word line to said gate electrode of said second transistor.

2. The circuit as defined by claim 1 and further including a third transistor connected between said word line and said charge pump node and having a gate electrode connected to said voltage potential ($V_{CC}$), for dissipating charge on said charge pump node when said word line is not selected.

3. The circuit as defined by claim 2 wherein said third transistor connected between said word line and said charge pump node comprises an enhancement mode field effect transistor.

4. The circuit as defined by claim 3 wherein said first transistor and said second transistor are enhancement mode transistors.

5. The circuit as defined by claim 1 wherein said first transistor and said second transistor are enhancement mode transistors.

* * * * *